(12) United States Patent
Chen et al.

(10) Patent No.: US 11,545,520 B2
(45) Date of Patent: Jan. 3, 2023

(54) DISPLAY DEVICE

(71) Applicant: Innolux Corporation, Miao-Li County (TW)

(72) Inventors: Yi-An Chen, Miao-Li County (TW); Wan-Ling Huang, Miao-Li County (TW); Tsau-Hua Hsieh, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 205 days.

(21) Appl. No.: 16/995,828

(22) Filed: Aug. 18, 2020

(65) Prior Publication Data

US 2021/0066389 A1    Mar. 4, 2021

Related U.S. Application Data

(60) Provisional application No. 62/893,802, filed on Aug. 29, 2019.

(30) Foreign Application Priority Data

Jun. 12, 2020   (CN) .......................... 202010533121.8

(51) Int. Cl.
*H01L 27/15* (2006.01)
*H01L 33/48* (2010.01)
(Continued)

(52) U.S. Cl.
CPC .......... *H01L 27/156* (2013.01); *H01L 33/486* (2013.01); *H01L 33/50* (2013.01); *H01L 33/58* (2013.01)

(58) Field of Classification Search
CPC ..... H01L 27/156; H01L 33/486; H01L 33/50; H01L 33/58
See application file for complete search history.

(56) References Cited

U.S. PATENT DOCUMENTS

2016/0293687 A1   10/2016   Chang et al.
2017/0077436 A1    3/2017   Yue et al.
(Continued)

FOREIGN PATENT DOCUMENTS

CN       106104660     11/2016
EP        3439033      2/2019
(Continued)

OTHER PUBLICATIONS

"Office Action of Taiwan Counterpart Application", dated Oct. 14, 2021, p. 1-p. 7.
(Continued)

*Primary Examiner* — Jay C Chang
*Assistant Examiner* — Mikka Liu
(74) *Attorney, Agent, or Firm* — JCIPRNET

(57) ABSTRACT

The display device includes a first unit, and a plurality of second units. The first unit includes a first substrate, and a light blocking structure disposed on the first substrate. The light blocking structure has a plurality of first openings. Each one of the second units includes a second substrate, and a plurality of light emitting diodes disposed on the second substrate. The light emitting diodes correspond to a portion of the first openings. The second units are adhered to the first unit.

9 Claims, 9 Drawing Sheets

(51) Int. Cl.
  *H01L 33/50* (2010.01)
  *H01L 33/58* (2010.01)

(56) References Cited

U.S. PATENT DOCUMENTS

2017/0358604 A1* 12/2017 Lee .................... H01L 27/1248
2018/0061903 A1   3/2018 Yang
2019/0041701 A1   2/2019 Chen et al.
2019/0212610 A1*  7/2019 Kim .................... H01L 27/322

FOREIGN PATENT DOCUMENTS

| JP | 2006164618 | 6/2006 |
| TW | 201511254 | 3/2015 |
| WO | 2019026858 | 2/2019 |

OTHER PUBLICATIONS

"Office Action of Taiwan Counterpart Application", dated Mar. 18, 2021, p. 1-p. 6.
"Search Report of Europe Counterpart Application", dated Jan. 26, 2021, p. 1-p. 13.
"Office Action of China Counterpart Application", dated Apr. 20, 2022, p. 1-p. 12.

* cited by examiner

DISPLAY DEVICE

CROSS-REFERENCE TO RELATED APPLICATION

This application claims the priority benefits of U.S. provisional application Ser. No. 62/893,802, filed on Aug. 29, 2019, and China application serial no. 202010533121.8, filed on Jun. 12, 2020. The entirety of each of the above-mentioned patent applications is hereby incorporated by reference herein and made a part of this specification.

BACKGROUND OF THE INVENTION

1. Field of the Invention

The present disclosure relates to an electronic device, in particular to a display device.

2. Description of Related Art

With the rapid development of electronic products, the display technology applied to the electronic products is also being constantly improved. In order to achieve a large format display, it is necessary to use spliced displays. Electronic devices used for display are constantly improved towards display effects of larger and higher resolution images.

SUMMARY OF THE INVENTION

The present disclosure provides a display device with good display quality or visual effect.

According to an embodiment of the present disclosure, the display device includes a first unit and a plurality of second units. The first unit includes a first substrate and a light blocking structure. The light blocking structure is disposed on the first substrate, and the light blocking structure has a plurality of first openings. Each one of the plurality of second units includes a second substrate and a plurality of light emitting diodes. The plurality of light emitting diodes are disposed on the second substrate, and the light emitting diodes correspond to a portion of the plurality of first openings. The plurality of second units are adhered to the first unit.

Based on the above, the display device of the embodiment of the present disclosure includes the first unit and the plurality of second units, and the plurality of light emitting diodes on the second units are disposed corresponding to the first openings of the first unit. Since the plurality of second units may be disposed and spliced directly on the first unit, a manufacturing process of the display device may be simplified. A frame size of the second units may further be reduced. Therefore, the display device may achieve the visual effect of seamless splicing or have good display quality. In addition, a gap between two adjacent second units may be blocked by the light blocking structure of the first unit. In this way, the gap and/or a splicing line between the two adjacent second units may not be easily observed by a user. Therefore, the display device has good display quality or visual effect.

DESCRIPTION OF THE EMBODIMENTS

Figure 1:
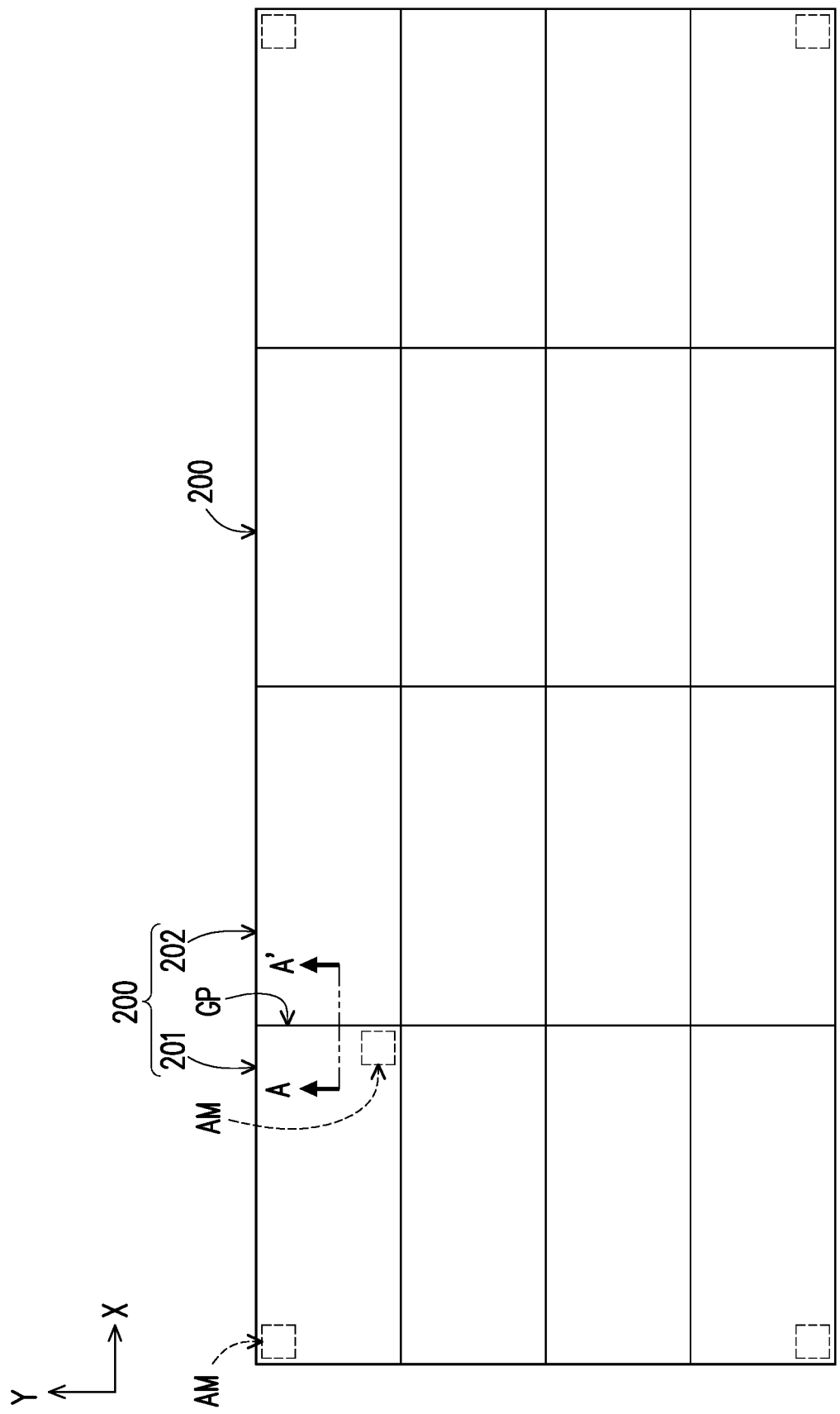
FIG. 1 is a schematic top view diagram of a display device in an embodiment of the present disclosure.

Some words are used to refer to specific components in the whole specification and the appended claims in the present disclosure. A person skilled in the art should understand that an electronic device manufacturer may use different names to refer to the same components. This specification is not intended to distinguish components that have the same functions but different names. In this specification and the claims, words such as "include", "comprise", and "have" are open words, and should be interpreted as "including, but not limited to". Therefore, when terms "include", "comprise", and/or "have" are used in the description of the present disclosure, the presence of corresponding features, regions, steps, operations and/or components is specified without excluding the presence of one or more other features, regions, steps, operations and/or components.

The directional terms mentioned herein, such as "above", "below", "front", "back", "left", and "right", refer to the directions in the accompanying drawings. Therefore, the directional terms are only used for illustration instead of limiting the present disclosure. In the accompanying drawings, common features of a method, a structure and/or a material used in a specific embodiment are shown in the drawings. However, these drawings should not be construed as defining or limiting the scope or nature of these embodiments. For example, the relative sizes, thicknesses and positions of films, regions and/or structures may be reduced or enlarged for clarity.

It should be understood that, when a component or a film is referred to as being "connected to" another component or film, it may be directly connected to another component or film, or there are components or films inserted between the two components or films. When a component or a film is referred to as being "directly connected to" another component or film, there is no component or film inserted between the two components or films. In addition, when a component is referred to as being "coupled to another component (or a variant thereof)", it may be directly connected to another component, or may be indirectly connected to (for example, electrically connected to) the another component through one or more components.

The term "approximately", "equal to", "the same as", "substantially" or "roughly" is generally interpreted as being within 20% of a given value or range, or interpreted as being within 10%, 5%, 3%, 2%, 1% or 0.5% of a given value or range.

A structure (or layer, component, substrate) being located on another structure (or layer, component, substrate) described in the present disclosure may mean that two structures are adjacent and directly connected, or may mean that two structures are adjacent and indirectly connected. Indirect connection means that there is at least one intermediate structure (or intermediate layer, intermediate component, intermediate substrate, intermediate spacing) between two structures, the lower surface of a structure is adjacent or directly connected to the upper surface of the intermediate structure, and the upper surface of the other structure is adjacent or directly connected to the lower surface of the intermediate structure. The intermediate structure may be a single-layer or multi-layer physical structure or non-physical structure, which is not limited. In the present disclosure, when a structure is on or disposed "on" another structure, it may mean that a structure is "directly" disposed on another structure, or a structure is "indirectly" disposed on another structure, that is, at least one structure is sandwiched between a structure and another structure.

The terms such as "first", "second", and the like in this specification may be used for describing various elements, components, areas, layers, and/or parts, but the elements, components, areas, layers, and/or parts are not limited by such terms. The terms are only used to distinguish one element, component, area, layer, or part from another element, component, area, layer, or part. Therefore, a "first component", "first element", "first region", "first layer", or "first part" discussed below is used to distinguish it from a "second component", "second element", "second region", "second layer", or "second part", and is not used to define an order or a specific component, element, region, layer and/or part.

In the present disclosure, various embodiments described below may be used in any combination without departing from the spirit and scope of the present disclosure, for example, some features of one embodiment may be combined with some features of another embodiment to form another embodiment.

An electronic device of the present disclosure may include a display device, an antenna device, a sensing device, a splicing device or a transparent display device, but is not limited thereto. The electronic device may be rollable, stretchable, bendable or flexible. The electronic device may include, for example, a liquid crystal, a light emitting diode (LED), a quantum dot (QD), fluorescence, phosphor or other suitable materials that are capable of being arranged and combined at will, or other suitable display media, or a combination of the above. The LED may include, for example, an organic light emitting diode (OLED), a mini light emitting diode (mini LED), a micro light emitting diode (micro LED) or a quantum dot (QD) light emitting diode (such as a QLED and a QDLED), but is not limited thereto. The antenna device may be, for example, a liquid crystal antenna, but is not limited thereto. The splicing device may be, for example, a display splicing device or an antenna splicing device, but is not limited thereto. It should be noted that the electronic device may be any combination of the above arrangements, but is not limited thereto. The content of the present disclosure will be described by using the display device or splicing device as the electronic device below, but the present disclosure is not limited thereto.

In the present disclosure, various embodiments described below may be used in any combination without departing from the spirit and scope of the present disclosure, for example, some features of one embodiment may be combined with some features of another embodiment to form another embodiment.

Exemplary embodiments of the present disclosure are described in detail, and examples of the exemplary embodiments are shown in the accompanying drawings. Whenever possible, the same component symbols are used in the drawings and descriptions to indicate the same or similar parts.

Figure 2:
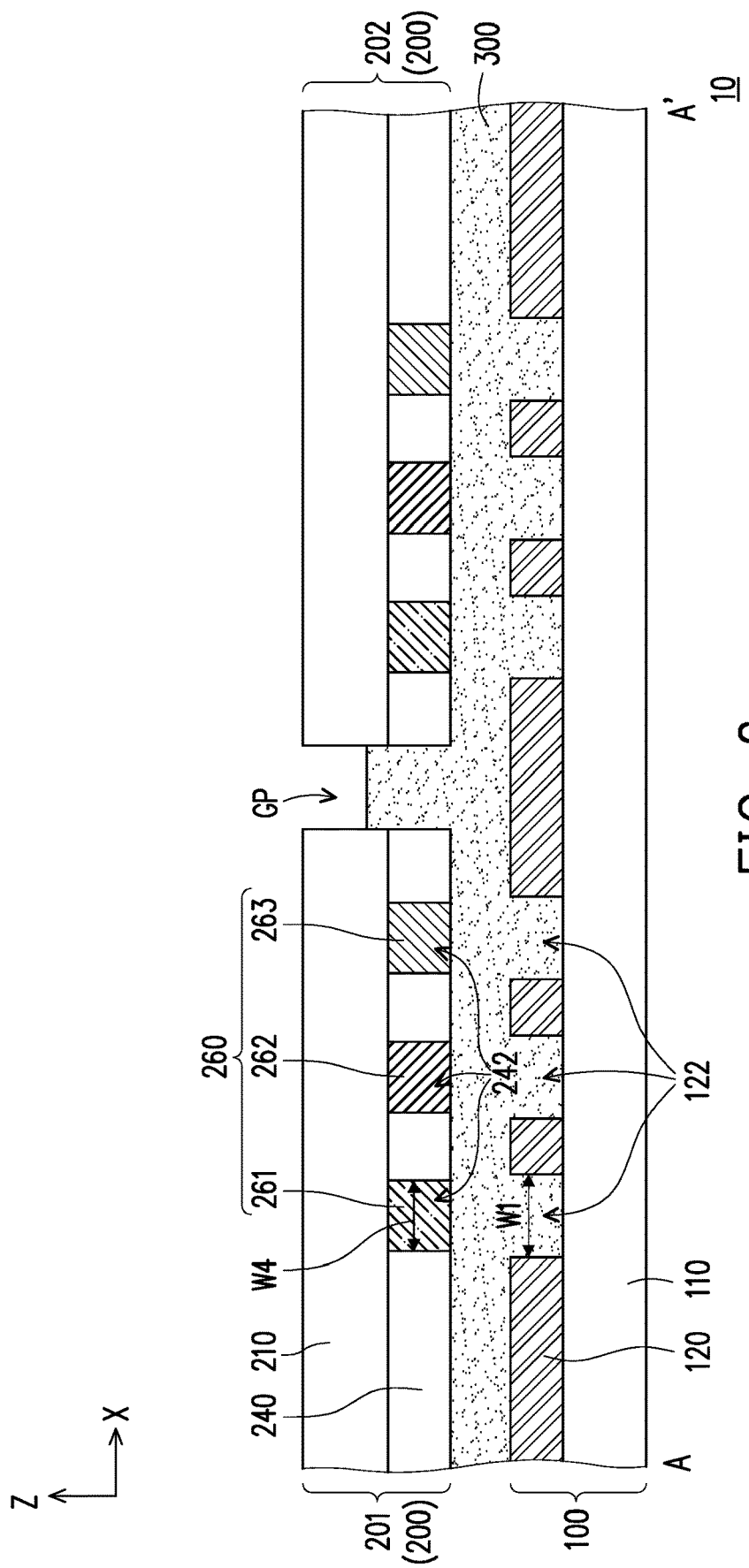
FIG. 2 is a schematic cross-sectional diagram of the display device in FIG. 1 along a cross-sectional line A-A'.

FIG. 1 is a schematic top view diagram of a display device in an embodiment of the present disclosure. For the sake of clear drawings and convenient explanation, a plurality of elements are omitted in FIG. 1. FIG. 2 is a schematic cross-sectional diagram of the display device in FIG. 1 along a cross-sectional line A-A'. For the sake of clear drawings and convenient explanation, a plurality of elements are omitted in FIG. 2. Referring to FIG. 1 and FIG. 2, the display device 10 of the present disclosure includes a first unit 100 and a plurality of second units 200. The plurality of second units 200 are disposed on the first unit 100. In the present embodiment, the first unit 100 includes, for example, a cover plate or a color filter substrate. Each one of the second units 200 includes, for example, a display panel. Under the above configurations, since the first unit 100 and the second units 200 may be manufactured respectively and then the plurality of second units 200 are disposed and spliced directly on the first unit 100, a manufacturing process of the display device 10 may be simplified, or the manufacturing cost may be reduced. In addition, since a plurality of display panels (the second units 200) may be directly disposed on one cover plate and/or one color filter substrate (such as the first unit 100), a frame size of the display panels may be reduced. Thus, the display device 10 may achieve a visual effect of seamless splicing or have good display quality.

A splicing method of the present embodiment will be explained simply through FIG. 1 and FIG. 2. First, the first unit 100 is provided. As shown in FIG. 2, the first unit 100 includes a first substrate 110 and a light blocking structure 120 disposed on the first substrate 110. The light blocking structure 120 has a plurality of first openings 122. In the present embodiment, the first substrate 110 includes, for example, a rigid substrate or a flexible substrate. For example, a material of the first substrate 110 may include glass, quartz, sapphire, ceramic, polycarbonate (PC), polyimide (PI), polyethylene terephthalate (PET), other suitable substrate materials, or a combination of the above, but is not limited thereto. The light blocking structure 120 is, for example, a black matrix with a light blocking effect and low reflection characteristics. For example, a material of the light blocking structure 120 may include a metal or a tinted opaque resin, or other suitable materials, or a combination of the above materials, but is not limited thereto. The metal may be, for example, chromium (Cr), but is not limited thereto. The resin may be, for example, an epoxy resin or an acrylic resin, or other suitable materials, or a combination of the above materials, but is not limited thereto.

Next, the plurality of second units 200 are provided. Each one of the plurality of second units 200 includes a second substrate 210 and a plurality of LEDs 260 disposed on the second substrate 210. The second substrate 210 includes, for example, a rigid substrate or a flexible substrate. For example, a material of the second substrate 210 may include glass, quartz, sapphire, ceramic, polycarbonate (PC), polyimide (PI), polyethylene terephthalate (PET), other suitable substrate materials, or a combination of the above, but is not limited thereto. The LEDs 260 include, for example, red LEDs 261, green LEDs 262 and blue LEDs 263, but are limited thereto. From another perspective, the LEDs 260 may be in red, blue and green colors. That is to say, the second units 200 of the present embodiment include, for example, display panels with functions of displaying images, but the present disclosure is not limited thereto.

Then, an optical adhesive layer 300 is disposed between the first unit 100 and the second units 200. For example, the optical adhesive layer 300 may be disposed on the first unit 100, or, in another embodiment, the optical adhesive layer 300 may also be disposed on the second units 200. Because the optical adhesive layer 300 is disposed between the first unit 100 and the second units 200, the second units 200 may be attached or fixed to the first unit 100. A material of the optical adhesive layer 300 may be an optical clear adhesive (OCA) with viscosity, an optical clear resin (OCR) or other suitable materials, or a combination of the above materials, but is not limited thereto. When the optical adhesive layer 300 is made of the OCR, its viscosity, for example, is in a range of 10 mPa·s to 100 mPa·s, but the present disclosure is not limited thereto.

In some embodiments, the display device 10 further includes a dam. The dam (not shown) may be disposed on the first unit 100 or the second units 200. The dam may surround an edge of the first unit 100. Or, the dam may surround edges of the second units 200. In the above configurations, the optical adhesive layer 300 may be fixed between the first unit 100 and the second units 200 through the surrounding of the dam, and the optical adhesive layer 300 is not easy to overflow. A material of the dam includes an adhesive material with high viscosity or other suitable materials, but is not limited thereto. When the dam is disposed on the second units 200, the material of the dam may be a transparent adhesive material with high transparency, but is not limited thereto. Thus, the display device 10 may have good display quality.

Next, as shown in FIG. 1, the plurality of second units 200 may be arranged in directions of an X-axis and a Y-axis so as to be spliced on the first unit 100. For example, on the X-axis, a second unit 201 and a second unit 202 may be spliced adjacently on the first unit 100. In the present disclosure, the X-axis may be in the top view direction of the display device 10 and extends from left to right. The Y-axis is perpendicular to the X-axis, and extends from top to bottom in the top view direction of the display device 10.

As shown in FIG. 1, for example, the display device 10 is a display device 10 with 4x4 display panels which are formed by splicing four second units 200 spliced on the X-axis and four second units 200 spliced on the Y-axis, but the present disclosure is not limited thereto. In some embodiments, the display device may also be a spliced display device with 3x3, 5x5 or other combinations.

In the present disclosure, according to users' design and requirements, a gap GP may be formed between the second unit 201 and the second unit 202. There may be a gap GP between any two of the adjacent second units 200. The gap GP may also be referred to as a splicing line.

It should be noted here that the display device 10 of the present embodiment includes, for example, alignment between the first unit 100 and the second units 200 by means of penetrating alignment or image identification alignment. In the means of penetrating alignment, alignment marks AM may be formed on two opposite sides of the first unit 100 and two opposite sides of the second units 200 by laser for example, then the alignment marks AM on the first unit 100 and the alignment marks AM on the second units 200 are aligned correspondingly, so that the corresponding alignment marks AM are overlapped to achieve the alignment. As shown in FIG. 1, the alignment marks AM may be disposed at four corners of the edge of the first unit 100 (not shown, the first unit 100 overlaps a plurality of spliced second units 200) or any positions in the first unit 100. In addition, the alignment marks AM may be disposed at four corners of the edge of each one of the second units 200, or any positions in the second units 200, but the present disclosure is not limited thereto. It should be noted that part of the alignment marks AM may overlap a display area of the display device 10. However, the alignment marks AM on the first unit 100 observed by a user may be manufactured on the light blocking structure 120. In this way, the influence of the alignment marks AM on the display quality may be reduced.

In the means of image identification alignment, an image identification system may identify surface features on the first unit 100 through a camera, and then the second units 200 are disposed on the corresponding positions on the first unit 100 according to the identified surface features to achieve the alignment. Thus, the first unit 100 and the second units 200 may achieve an excellent alignment effect by penetrating alignment or image identification alignment. In this way, the second units 200 may be spliced on the first unit 100 to obtain the display device 10 with good quality.

A configuration of the display device 10 of the present embodiment will be explained simply through FIG. 1 and FIG. 2.

Referring to FIG. 2, FIG. 2 shows a schematic cross-sectional diagram of two second units 200 spliced on the first unit 100. In the present embodiment, the first unit 100 includes the first substrate 110 and the light blocking structure 120 disposed on the first substrate 110. The light blocking structure 120 is provided with the plurality of first openings 122. That is to say, the first unit 100 may include a plurality of black matrixes, but the present disclosure is not limited thereto.

The second units 200 include the second unit 201 and the second unit 202. The second unit 201 and the second unit 202 are disposed on the first unit 100 after alignment. The gap GP is formed between the second unit 201 and the second unit 202. In the present embodiment, in the X-axis direction, the width of the gap GP may be determined according to the user's design and requirements, for example, 0 μm to 200 μm, but is not limited thereto.

In the present embodiment, each one of the second units 200 is further provided with an another bank layer 240. The another bank layer 240 is disposed on the second substrate 210. For example, a material of the another bank layer 240 may include an acrylic resin, siloxane, a photoresist material or other suitable materials, or a combination of the above materials, but is not limited thereto. The another bank layer 240 is provided with a plurality of fourth openings 242.

The plurality of LEDs 260 are disposed in the plurality of fourth openings 242 respectively. For example, the red LEDs 261, the green LEDs 262 and the blue LEDs 263 may be disposed in the corresponding fourth openings 242 respectively. The plurality of fourth openings 242 correspond to the plurality of first openings 122 respectively. Thus, the LEDs 260 in the fourth openings 242 may correspond to a portion of the first openings 122. That is to say, the plurality of LEDs 260 are disposed corresponding to a portion of the plurality of first openings 122.

For example, in a Z-axis direction perpendicular to the first unit 100, the LEDs 260 may correspondingly overlap 20% to 100% of the first openings 122, and have a tolerance of ±10%, such as 20%±10%, 40%±10%, 60%±10%, 80%±10% or 100%, but are not limited thereto. In this way, light emitted by the LEDs 260 may pass through the first openings 122 and penetrate through the first unit 100.

In the present embodiment, a width W1 of the first openings 122 and a width W4 of the fourth openings 242 may be the same or different. For example, the width W1 may be greater or equal to the width W4, but is not limited thereto. In some embodiments, the width W1 may also be less than the width W4. In the present disclosure, the width W1 may be defined as a maximum width of the first openings 122 on the X-axis, wherein an example measurement method of the width W1 is as measuring distances of two sides on the X-axis in the first openings 122 of the light blocking structure 120 in the example cross-sectional direction in the present embodiment. The width W4 may be defined as a maximum width of the fourth openings 242 on the X-axis, wherein an example measurement method of the width W4 is as measuring distances of two sides on the X-axis in the fourth openings 242 of the another bank layer 240 in the example cross-sectional direction in the present embodiment. In the present disclosure, the X-axis is parallel to an extension direction of the first unit 100, and is perpendicular to the Z-axis. In the above configurations, the portion of the LEDs 260 correspondingly overlapping the first openings 122 may be lifted to achieve good display quality.

In the present embodiment, the optical adhesive layer 300 of the display device 10 is disposed between the first unit 100 and the second unit 201. The optical adhesive layer 300 is disposed between the first unit 100 and the second unit 202. The optical adhesive layer 300 may be partially located in the gap GP between the second unit 201 and the second unit 202, but the present disclosure is not limited thereto. In addition, the optical adhesive layer 300 may be disposed in the first openings 122 to increase a contact area or improve a bonding force. In this way, the display device 10 has good reliability.

It is worth noting that in the present embodiment, a portion of the light blocking structure 120 corresponds to the gap GP between any two second units 200. For example, on the Z-axis, the portion of the light blocking structure 120 corresponding to the gap GP may overlap the gap GP between the second unit 201 and the second unit 202. That is to say, on the X-axis, the width of the portion of the light blocking structure 120 corresponding to the gap GP may be greater than or equal to the width of the gap GP, but the present embodiment is not limited thereto. Thus, when the user observes the first unit 100, the portion of the light blocking structure 120 may block the gap GP (also known as the splicing line) between two adjacent second units 200. In this way, the splicing line between the two adjacent second units 200 is not easily observed by the user, and thus the visual effect of seamless splicing may be achieved. Therefore, the display device 10 may have good display quality or visual effect.

Other embodiments will be cited below as an explanation. It must be noted here that the following embodiments follow the element reference numbers and parts of contents of the above embodiments, wherein same reference numbers are adopted to represent the same or similar elements, and the description of the same technical content is omitted. The description of the omitted part may make reference to the above embodiments, and will not be repeated in the following embodiments.

Figure 3:
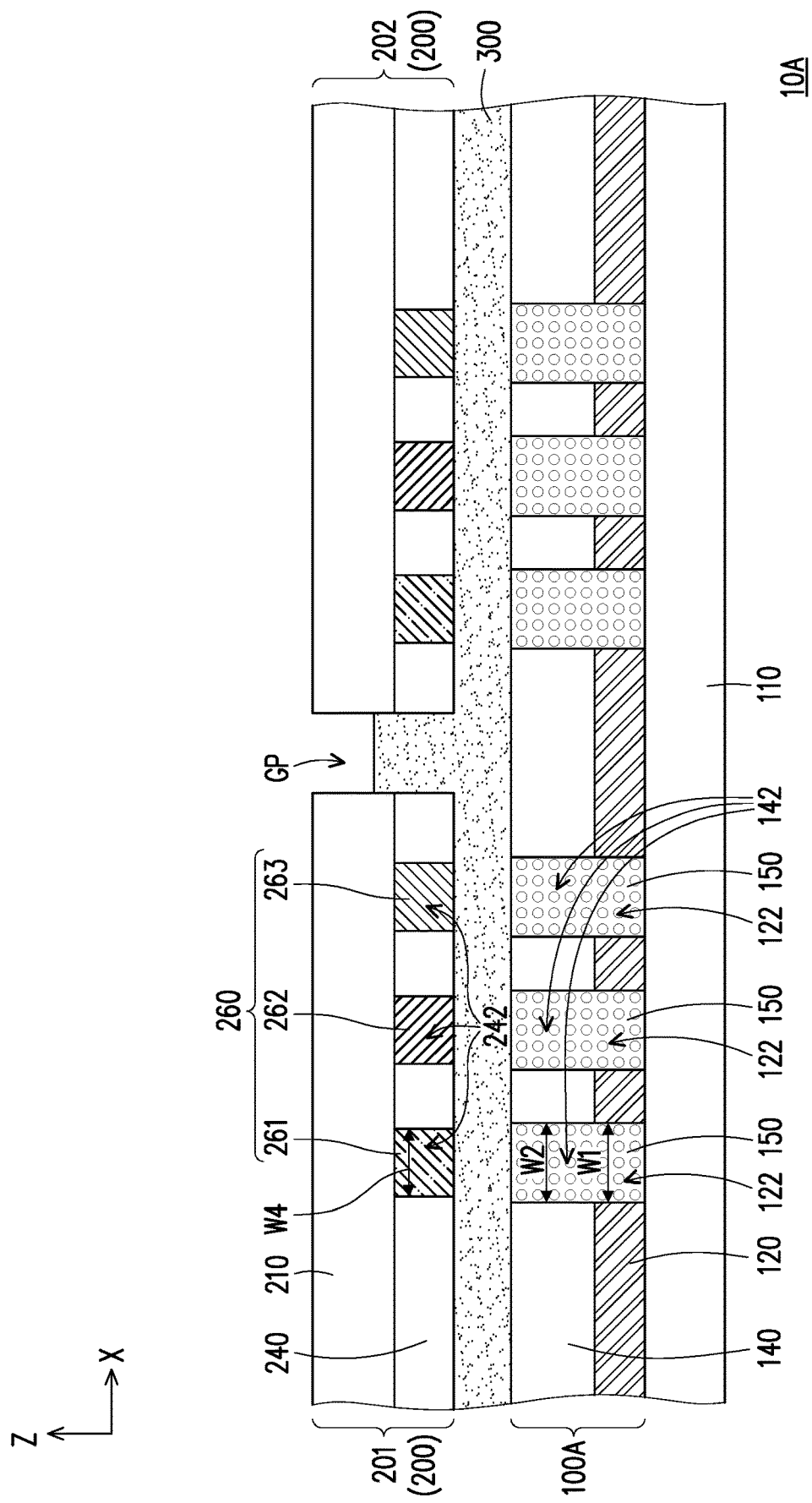
FIG. 3 is a schematic cross-sectional diagram of a display device in another embodiment of the present disclosure.

FIG. 3 is a schematic cross-sectional diagram of a display device in another embodiment of the present disclosure. A display device 10A of the present embodiment is substantially similar to the display device 10 in FIG. 2, and thus the same and similar components in the two embodiments are omitted herein. The present embodiment is different from the display device 10 in that a first unit 100A of the display device 10A includes a bank layer 140 disposed on the light blocking structure 120. In addition, the optical adhesive layer 300 is located between the bank layer 140 and the another bank layer 240. In the present embodiment, the bank layer 140 may include a material with a reflective effect, such as an acrylic resin mixed with titanium dioxide ($TiO_2$) or the $TiO_2$ and carbon black, siloxane, a photoresist material or other suitable materials or a combination of the above, but the present disclosure is not limited thereto.

The bank layer 140 has a plurality of second openings 142. The second openings 142 correspondingly overlap a portion of the plurality of first openings 122 of the light blocking structure 120 respectively. Thus, the portion of the second openings 142 corresponds to the LEDs 260 in the fourth openings 242. In the present embodiment, a width W2 of the second openings 142 and the width W1 of the first openings 122 may be the same or different, but the present embodiment is not limited thereto. In the present embodiment, the width W2 may be greater than or equal to the width W4, but is not limited thereto. In the present disclosure, the width W2 may be defined as a maximum width of the second openings 142 on the X-axis, wherein an example measurement method of the width W2 is as measuring distances of two sides on the X-axis in the second openings 142 of the bank layer 140 in the example cross-sectional direction in the present embodiment.

A scattering layer 150 is disposed in at least one of the plurality of second openings 142. In addition, the scattering layer 150 is disposed in the first openings 122 corresponding to the second openings 142. Thus, one of the LEDs 260 (such as the red LED 261, the green LED 262 or the blue LED 263) may be disposed corresponding to the scattering layer 150. In the present embodiment, a material of the scattering layer 150 may include a resin layer containing a light scattering agent such as microparticles for scattering light, or other suitable materials, or a combination of the above materials, but is not limited thereto. In this way, the light emitted by the LEDs 260 may be scattered or diffused by the scattering layer 150, and thus the light amount of visible light is increased. Thus, the display device 10A may have good display quality or display effect.

In addition, since the scattering layer 150 is disposed in the second openings 142 of the bank layer 140, the light emitted by the LEDs 260 may be reflected to improve the utilization of the light. Or, the bank layer 140 may limit a traveling direction of the light, and reduce the probability of mixing light. In addition, since the scattering layer 150 is disposed in the first openings 122 of the light blocking structure 120, a light emitting direction of the LEDs 260 or a viewing angle of the display device 10A may be increased. In this way, the display device 10A may have good display quality or display effect. In addition, the display device 10A may obtain an excellent technical effect similar to the above embodiment.

Figure 4:
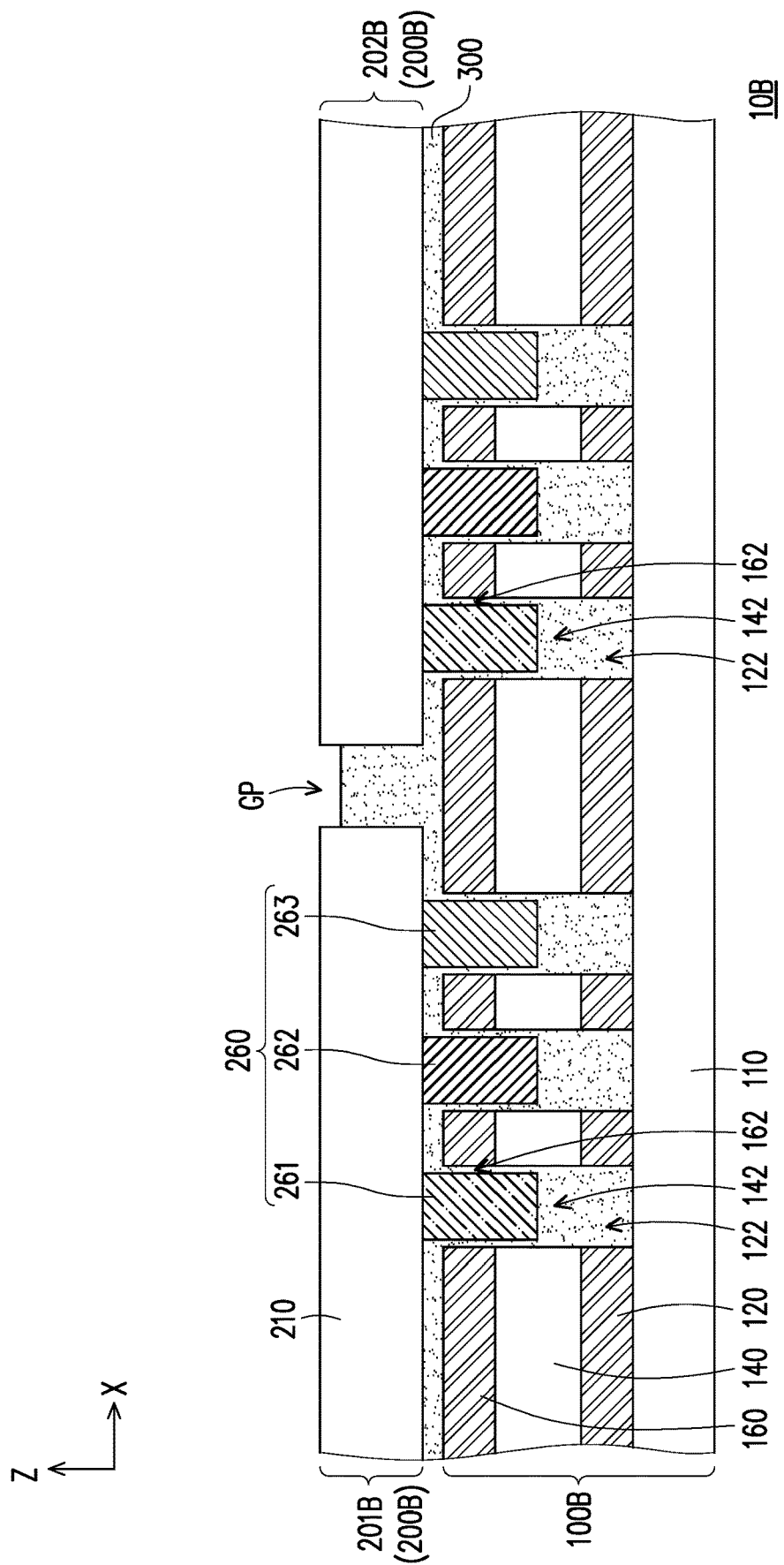
FIG. 4 is a schematic cross-sectional diagram of a display device in another embodiment of the present disclosure.

FIG. 4 is a schematic cross-sectional diagram of a display device in another embodiment of the present disclosure. A display device 10B of the present embodiment is substantially similar to the display device 10A in FIG. 3, and thus the same and similar components in the two embodiments are omitted herein. The present embodiment is different from the display device 10A in that a first unit 100B of the display device 10B includes an another light blocking structure 160 disposed on the bank layer 140. The bank layer 140 is disposed between the light blocking structure 120 and the another light blocking structure 160. A material of the another light blocking structure 160 is similar to the material of the light blocking structure 120, for example, a black matrix with a light blocking effect and low reflection characteristics, or other suitable materials or a combination of the above, but is not limited thereto, and thus it will not be repeated.

In the present embodiment, the another light blocking structure 160 is provided with a plurality of fifth openings 162. The fifth openings 162 are disposed corresponding to a portion of the second openings 142. In addition, the fifth openings 162 are disposed corresponding to a portion of the first openings 122.

In the present embodiment, second units 200B (including a second unit 201B and a second unit 202B) and the plurality of LEDs 260 are disposed on the second substrate 210 and correspond to a portion of the fifth openings 162, the second openings 142 and the first openings 122, and thus the LEDs 260 may be correspondingly located in the fifth openings 162 or the fifth openings 162 and the second openings 142, but are not limited thereto. In some embodiments, top surfaces of the LEDs 260 away from the second substrate 210 may be located in the second openings 142. In other embodiments, the top surfaces of the LEDs 260 away from the second substrate 210 may be aligned with a contact interface of the bank layer 140 and the light blocking structure 120, but are not limited thereto. In this way, the utilization of light may be improved, or the probability of mixing light may be reduced. The display device 10B may have good display quality or display effect.

In the present embodiment, the optical adhesive layer 300 may be located in the fifth openings 162, the second openings 142 and the first openings 122 to increase a contact area or improve a bonding force. In this way, the display device 10B has good reliability.

In addition, since an another bank layer may be omitted, the display device 10B may be thinned. In addition, the display device 10B may obtain an excellent technical effect similar to the above embodiments.

Figure 5:
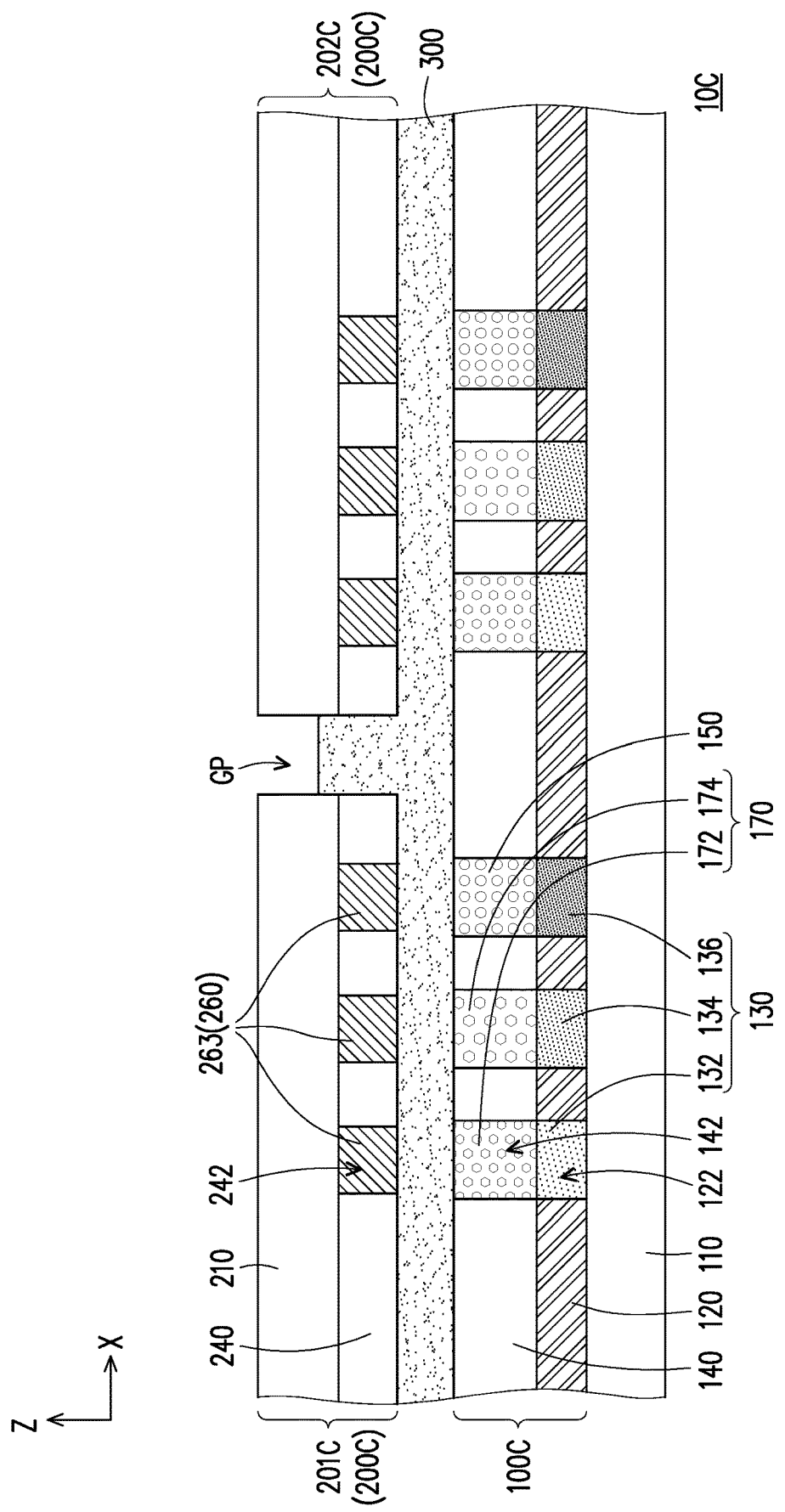
FIG. 5 is a schematic cross-sectional diagram of a display device in another embodiment of the present disclosure.

FIG. 5 is a schematic cross-sectional diagram of a display device in another embodiment of the present disclosure. A display device 10C of the present embodiment is substantially similar to the display device 10A in FIG. 3, and thus the same and similar components in the two embodiments are omitted herein. The present embodiment is different from the display device 10A in that the display device 10C includes a color filter 130 and a light conversion unit 170. In addition, the plurality of LEDs 260 of second units 200C (including a second unit 201C and a second unit 202C) are the blue LEDs 263.

In detail, in a first unit 100C, the color filter 130 is disposed in one of the plurality of first openings 122 of the light blocking structure 120. For example, the color filter 130 includes a red filter layer 132, a green filter layer 134 and a blue filter layer 136. In the present embodiment, the color filter 130 includes, for example, a color photoresist, but is not limited thereto.

The light conversion unit 170 includes a first light conversion unit 172 and a second light conversion unit 174. The first light conversion unit 172 is disposed in one of the plurality of second openings 142. The second light conversion unit 174 is disposed in another one of the plurality of second openings 142. In this way, the first light conversion unit 172 and the second light conversion unit 174 may be disposed corresponding to the plurality of blue LEDs 263.

In the present embodiment, the first light conversion unit 172 includes, for example, a QD material emitting red light. The second light conversion unit 174 includes, for example, a QD material emitting green light. In the above configurations, blue light emitted by the blue LEDs 263 may be converted into red light by the first light conversion unit 172.

The above red light may be reflected by the bank layer 140 to improve the utilization of the light. In addition, the red light may penetrate through the red filter layer 132 to provide the red light with good display quality. Similarly, the blue light emitted by the blue LEDs 263 may be converted into green light by the second light conversion unit 174. The above green light may be reflected by the bank layer 140 to improve the utilization of the light. In addition, the green light may penetrate through the green filter layer 134 to provide the green light with good display quality.

In the present embodiment, the first unit 100C includes the scattering layer 150 disposed in one of the plurality of second openings 142 and corresponding to the blue filter layer 136. In the above configurations, the blue light emitted by the blue LEDs 263 may be scattered or diffused by the scattering layer 150, and thus the light amount of the visible light is increased. The above blue light may be reflected by the bank layer 140 to improve the utilization of the light. In addition, the blue light may penetrate through the blue filter layer 136 to provide the blue light with good display quality. Therefore, the display device 10C may have good display quality or display effect. In addition, the display device 10C may obtain an excellent technical effect similar to the above embodiments.

Figure 6:
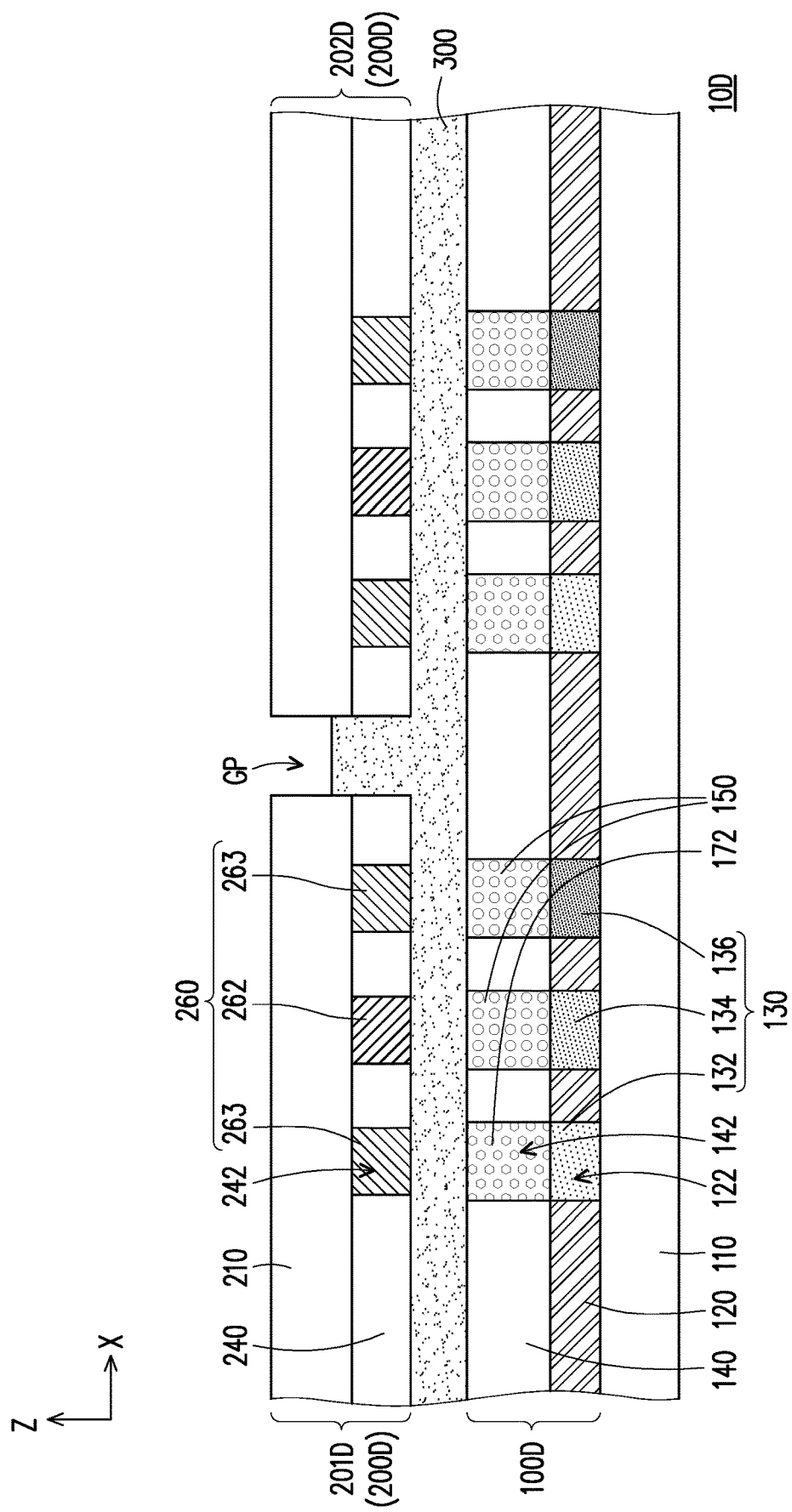
FIG. 6 is a schematic cross-sectional diagram of a display device in another embodiment of the present disclosure.

FIG. 6 is a schematic cross-sectional diagram of a display device in another embodiment of the present disclosure. A display device 10D of the present embodiment is substantially similar to the display device 10C in FIG. 5, and thus the same and similar components in the two embodiments are omitted herein. The present embodiment is different from the display device 10C in that the plurality of LEDs of the display device 10D are in green and blue colors. For example, the plurality of LEDs 260 of second units 200D (including a second unit 201D and a second unit 202D) include the green LEDs 262 and the blue LEDs 263.

In the present embodiment, a first unit 100D includes the first light conversion unit 172 disposed corresponding to the red filter layer 132. A plurality of scattering layers 150 are disposed corresponding to the green filter layer 134 and the blue filter layer 136 respectively. One of the plurality of blue LEDs 263 corresponds to the first light conversion unit 172 and the red filter layer 132. Another one of the plurality of blue LEDs 263 corresponds to the scattering layers 150 and the blue filter layer 136. The green LEDs 262 correspond to the scattering layers 150 and the green filter layer 134. In the above configurations, the blue light emitted by the blue LEDs 263 may be converted into red light by the first light conversion unit 172, and then penetrates through the red filter layer 132 to be emitted from the first unit 100D. The green light emitted by the green LEDs 262 may be scattered or diffused by the scattering layers 150, and then penetrates through the green filter layer 134 to be emitted from the first unit 100D. The blue light emitted by the blue LEDs 263 may be scattered or diffused by the scattering layers 150, and then penetrates through the blue filter layer 136 to be emitted from the first unit 100D. In this way, the display device 10D may have good display quality or display effect. In addition, the display device 10D may obtain an excellent technical effect similar to the above embodiments.

Figure 7:
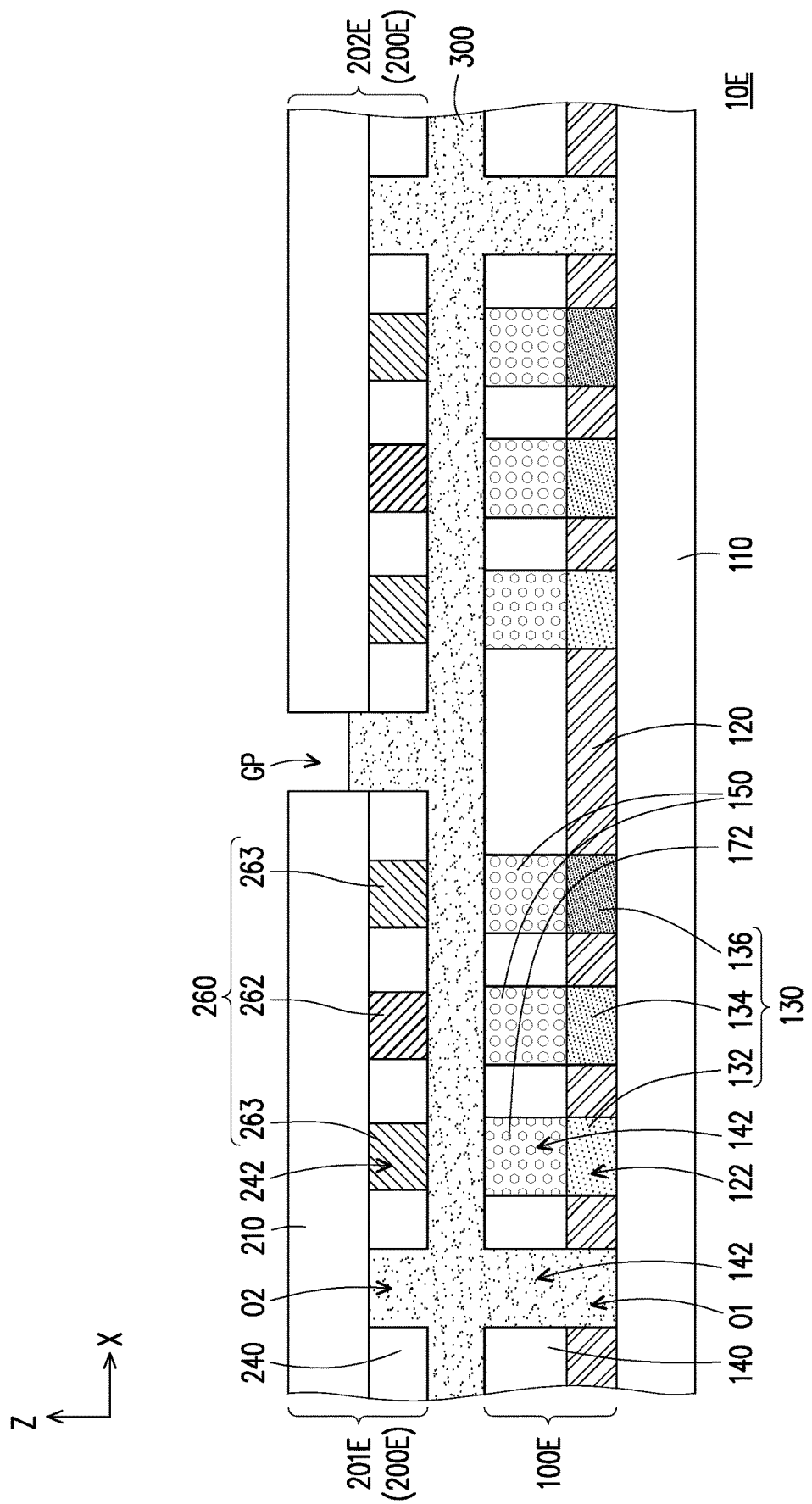
FIG. 7 is a schematic cross-sectional diagram of a display device in another embodiment of the present disclosure.

FIG. 7 is a schematic cross-sectional diagram of a display device in another embodiment of the present disclosure. A display device 10E of the present embodiment is substantially similar to the display device 10D in FIG. 6, and thus the same and similar components in the two embodiments are omitted herein. The present embodiment is different from the display device 10D in that the light blocking structure 120 of a first unit 100E is provided with a first through opening O1. The another bank layer 240 of second units 200E (including a second unit 201E and a second unit 202E) has a second through opening O2. The second through opening O2 corresponds to a portion of the first through opening O1. The first through opening O1 and the second through opening O2 of the present embodiment may be configured to increase perspective effect of a transparent display area.

In detail, the first through opening O1 of the first unit 100E may correspond to the portion of the second openings 142 of the bank layer 140. Therefore, the first unit 100E may be applied as a cover plate and/or a color filter substrate of a transparent display device.

The second through opening O2 of the second units 200E corresponds to the portion of the second openings 142, or corresponds to the portion of the first through opening O1. For example, the second through opening O2 may correspondingly overlap 20% to 100% of the first through opening O1, and has a tolerance of ±10%, such as 20%±10%, 40%±10%, 60%±10%, 80%±10% or 100%, but is not limited thereto. It should be noted here that according to the user's design and requirements, the number of the first through opening O1 and the second through opening O2 may be correspondingly multiple to achieve a balance between the perspective effect, aperture or resolution.

In this way, when the user observes the first unit 100E, the environment behind the second substrate 210 (such as glass) may be observed through the first through opening O1, the second openings 142 and the second through opening O2. That is to say, the display device 10E has a technology of being applied as the transparent display device. In addition, the display device 10E may obtain an excellent technical effect similar to the above embodiments.

Figure 8:
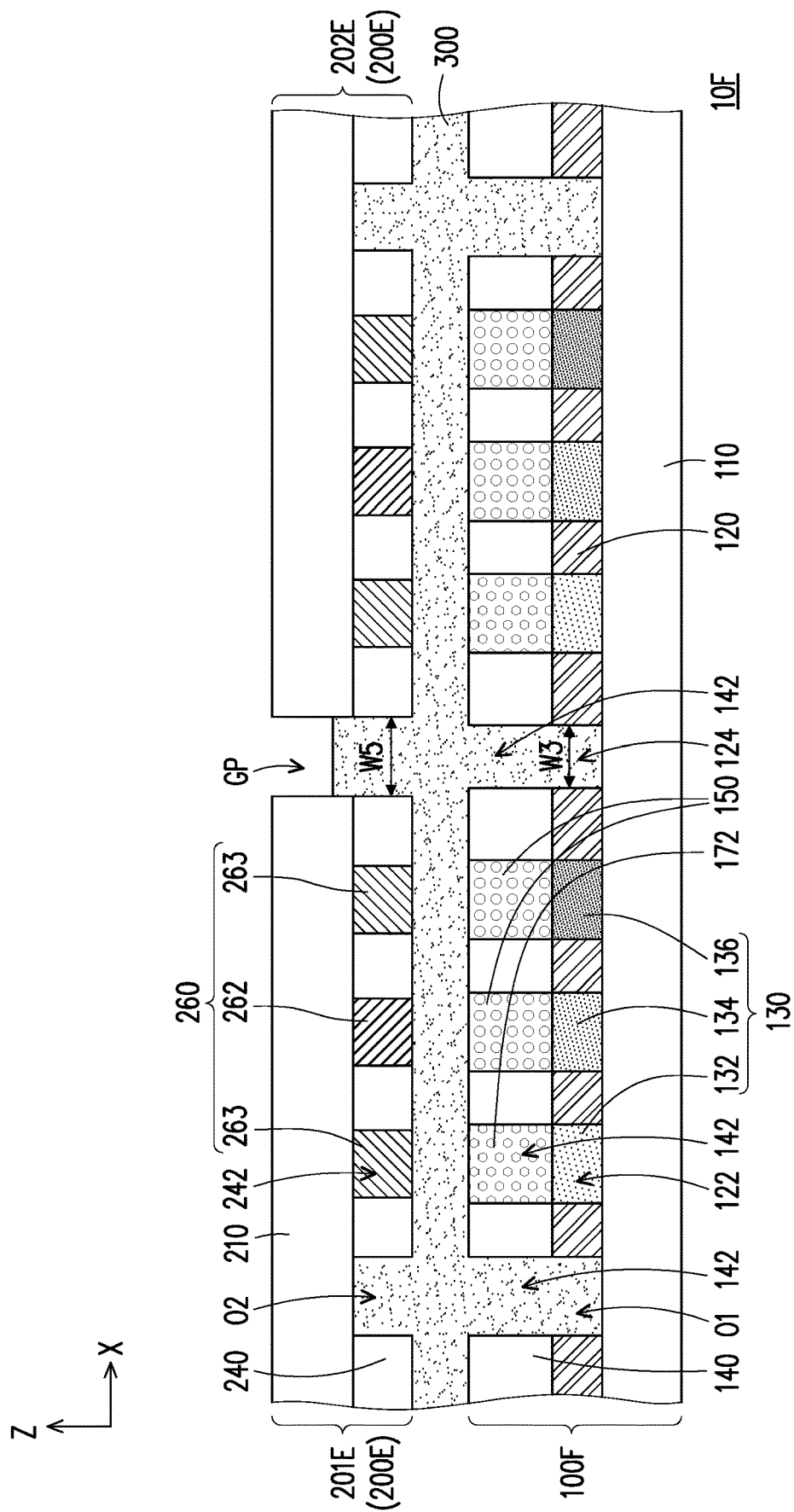
FIG. 8 is a schematic cross-sectional diagram of a display device in yet another embodiment of the present disclosure.

FIG. 8 is a schematic cross-sectional diagram of a display device in another embodiment of the present disclosure. A display device 10F of the present embodiment is substantially similar to the display device 10E in FIG. 7, and thus the same and similar components in the two embodiments are omitted herein. The present embodiment is different from the display device 10E in that the light blocking structure 120 of a first unit 100F includes the third openings 124. The third openings 124 correspond to the gap GP between two of the plurality of second units 200E (such as a second unit 201E and a second unit 202E).

In detail, the third openings 124 correspond to the portion of the second openings 142 of the bank layer 140. That is to say, in the present embodiment, in addition to the first through opening O1, the third openings 124 may also serve as one of a plurality of through openings used by the first unit 100E for achieving the perspective effect. Thus, when the third openings 124 correspond to the gap GP, the user may observe the environment behind the second substrate 210 through the third openings 124 and the gap GP. Therefore, the display device 10F has the technology of being applied as the transparent display device.

In the present embodiment, a width W3 of the third openings 124 and the width of the second openings 142 corresponding to the third openings 124 may be the same or different, but the present embodiment is not limited thereto. In the present embodiment, the width W3 of the third openings 124 is different from a width W5 of the gap GP. For example, the width W3 of the third openings 124 may be less than the width W5 of the gap GP. In the present disclosure, the width W3 may be defined as a maximum width of the third openings 124 on the X-axis, wherein an example measurement method of the width W3 is as measuring distances of two sides on the X-axis in the third openings 124 of the light blocking structure 120 in the example cross-sectional direction in the present embodiment. The width W5 may be defined as a maximum width of the gap GP on the X-axis, wherein an example measurement method of the width W5 is as measuring distances of two adjacent sides of the second unit 201E and the second unit 202E on the X-axis in the example cross-sectional direction in the present embodiment.

In this way, the portion of the light blocking structure 120 may block the portion of the gap GP (also known as the splicing line). In this way, the splicing line between the two adjacent second units 200 is not easily observed by the user, and thus the visual effect of seamless splicing may be achieved. In addition, the gap GP and the third openings 124 may be applied as the technology of the transparent display device. Therefore, the display device 10F may have good display quality or visual effect. In addition, the display device 10F may obtain an excellent technical effect similar to the above embodiments.

In other embodiments, the width W3 of the third openings 124 may be greater than the width W5 of the gap GP. In yet another embodiment, the width W3 of the third openings 124 may be equal to the width W5 of the gap GP. Thus, according to the user's design and requirements, an area of the third openings 124 correspondingly overlapping the gap GP may be increased. In this way, the display device 10F may have a good perspective effect or aperture.

Figure 9:
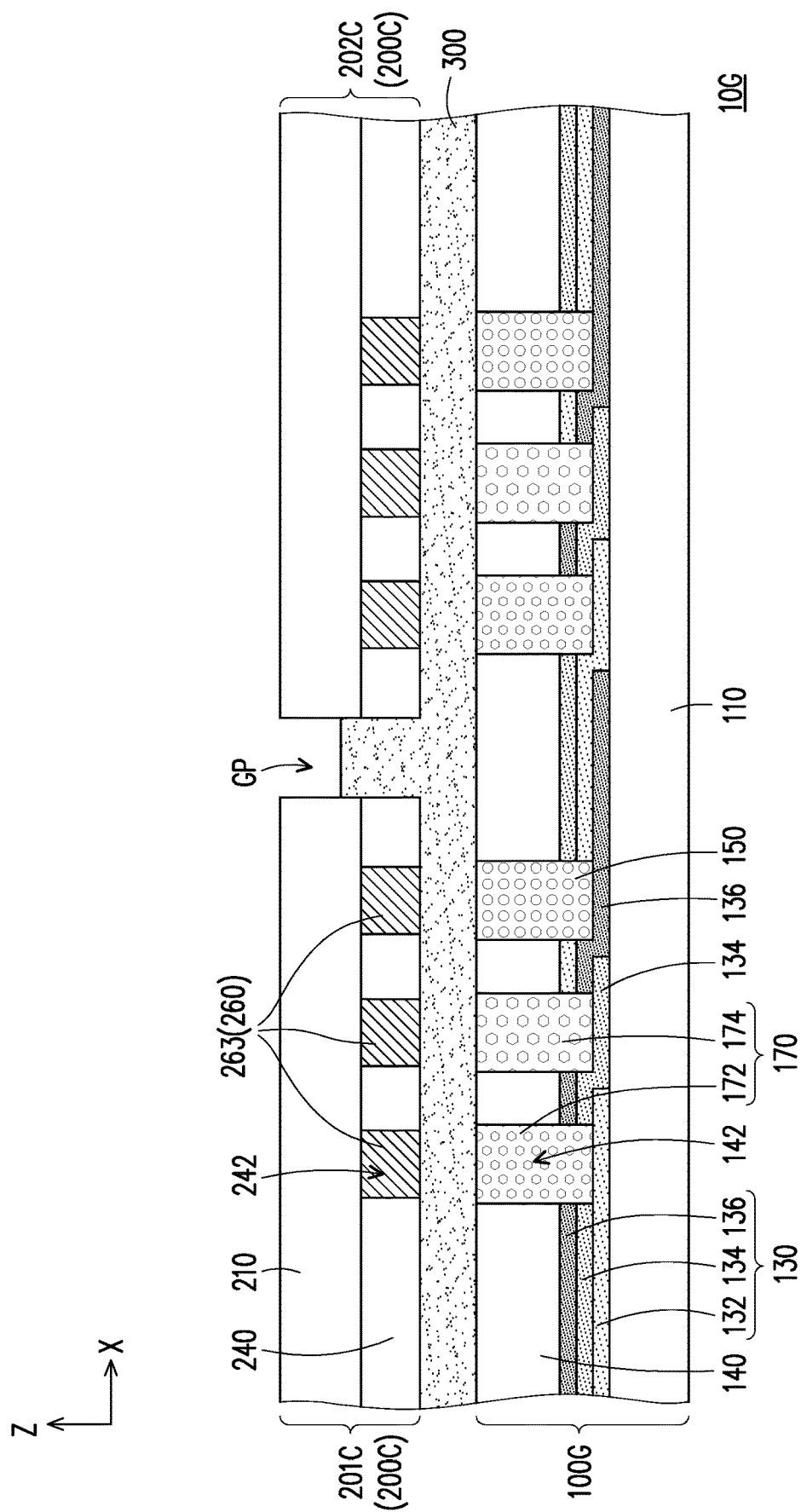
FIG. 9 is a schematic cross-sectional diagram of a display device in yet another embodiment of the present disclosure.

FIG. 9 is a schematic cross-sectional diagram of a display device in another embodiment of the present disclosure. A display device 10G of the present embodiment is substantially similar to the display device 10C in FIG. 5, and thus the same and similar components in the two embodiments are omitted herein. The present embodiment is different from the display device 10C in that a first unit 100G takes a plurality of laminated color filter 130 as the light blocking structure. For example, the plurality of laminated color filter 130 may include a red filter layer 132, a green filter layer 134 and a blue filter layer 136 which are partially stacked on the first substrate 110 with each other. The bank layer 140 is provided with the plurality of second openings 142. Three of the plurality of second openings 142 may be disposed corresponding to the red filter layer 132, the green filter layer 134 and the blue filter layer 136 respectively. That is to say, the three second openings 142 may correspond to three colors respectively, but the present embodiment is not limited thereto.

In the present embodiment, the first light conversion unit 172 is disposed on the plurality of second openings 142, and corresponds to the red filter layer 132. The second light conversion unit 174 is disposed on the plurality of the second openings 142, and corresponds to the green filter layer 134. The scattering layers 150 are disposed on the plurality of second openings 142, and correspond to the blue filter layer 136. In the present embodiment, the first light conversion unit 172 is, for example, the QD material emitting red light. The second light conversion unit 174 is, for example, the QD material emitting green light. Thus, the display device 10G has good display quality or display effect.

It is worth noting that the red filter layer 132, the green filter layer 134 and the blue filter layer 136 are partially stacked on the first substrate 110 with each other in a portion other than orthographic projections of the second openings 142 on the first substrate 110. For example, stacking of the red filter layer 132, the green filter layer 134 and the blue filter layer 136 may correspondingly overlap the gap GP. Thus, since the plurality of laminated color filter 130 may correspondingly filter out the red light, the green light and the blue light, the light may be absorbed by the plurality of laminated color filter 130 and does not easily penetrate. In this way, the plurality of laminated color filter 130 may be applied as the light blocking structure. Thus, the plurality of laminated color filter 130 may block the gap GP (also known as the splicing line). In this way, the splicing line between the two adjacent second units 200C is not easily observed by the user, and thus the visual effect of seamless splicing may be achieved. Therefore, the display device 10G may have good display quality or visual effect. In addition, the display device 10G may obtain an excellent technical effect similar to the above embodiments.

Based on the above, the display device of the embodiment of the present disclosure includes the first unit and the plurality of second units, and the plurality of LEDs on the second units are disposed corresponding to the first openings of the first unit. Since the plurality of second units may be spliced on the first unit, the manufacturing process of the display device may be simplified. The frame size of the second units may be reduced. Therefore, the display device may achieve the visual effect of seamless splicing or have good display quality. In addition, the gap between two adjacent second units may be blocked by the light blocking structure of the first unit. In this way, the gap and/or a splicing line between the two adjacent second units are/is not easily observed by the user. Therefore, the display device has good display quality or visual effect. In addition, the display device of the present disclosure may increase the utilization of the light or reduce the probability of mixing light respectively through the bank layer or the light blocking structure.

In addition, the display device of the present disclosure may include the scattering layers and the light conversion unit, so as to provide the light with good display quality, and thus the display device has good display quality or display effect. In addition, the display device of the present disclosure can include the first through opening and the second through opening. Or, the third openings are disposed on the light blocking structure corresponding to the gap. In this way, the display device can have a good perspective effect or aperture. The display device can be applied as the transparent display device.

In addition, the display device of the present disclosure can apply the plurality of laminated color filter as the light blocking structure, and thus the display device has good display quality or visual effect.

It should be finally noted that the above embodiments are merely intended for describing the technical solutions of the present disclosure rather than limiting the present disclosure. The features of the embodiments may be used in any combination without departing from the spirit of the present disclosure or conflicting with each other. Although the present disclosure is described in detail with reference to the foregoing embodiments, those of ordinary skill in the art should understand that they can still make modifications to the technical solutions described in the foregoing embodiments or make equivalent substitutions to some or all technical features thereof, without departing from scope of the technical solutions of the embodiments of the present disclosure.

What is claimed is:

1. A display device, comprising:
    a first unit, the first unit comprises:
        a first substrate; and
        a light blocking structure having a plurality of first openings and disposed on the first substrate; and
    a plurality of second units, each comprises:
        a second substrate; and
        a plurality of light emitting diodes disposed on the second substrate and corresponding to a portion of the plurality of first openings;
    wherein the plurality of second units are adhered to the first unit,
    wherein the light blocking structure further comprises a third opening corresponding to a gap between two of the plurality of second units.

2. The display device according to claim 1, wherein the display device further comprises a color filter disposed in one of the plurality of first openings.

3. The display device according to claim 1, wherein the first unit further comprises:
    a bank layer having a plurality of second openings and disposed on the light blocking structure; and
    a light conversion unit disposed in one of the plurality of second openings.

4. The display device according to claim 1, wherein the first unit further comprises:
    a bank layer having a plurality of second openings and disposed on the light blocking structure; and
    a scattering layer disposed in one of the plurality of second openings.

5. The display device according to claim 1, wherein the plurality of light emitting diodes are in red, blue and green colors.

6. The display device according to claim 1, wherein the plurality of light emitting diodes are in green and blue colors.

7. The display device according to claim 1, wherein a width of the third opening is different from a width of the gap.

8. The display device according to claim 1, wherein the first unit further comprises another light blocking structure and a bank layer disposed between the light blocking structure and the another light blocking structure.

9. The display device according to claim 1, wherein each one of the plurality of second units has an another bank layer, and the another bank layer is disposed on the second substrate;
    wherein the light blocking structure has a first through opening, and the another bank layer has a second through opening,
    wherein the second through opening corresponds to a portion of the first through opening.

* * * * *